(12) United States Patent
de Rooij et al.

(10) Patent No.: US 7,760,005 B2
(45) Date of Patent: Jul. 20, 2010

(54) POWER ELECTRONIC MODULE INCLUDING DESATURATION DETECTION DIODE

(75) Inventors: Michael Andrew de Rooij, Schenectady, NY (US); Eladio Clemente Delgado, Burnt Hills, NY (US); Stephen Daley Arthur, Glenville, NY (US)

(73) Assignee: General Electric Company, Niskayuna, NY (US)

( * ) Notice: Subject to any disclaimer, the term of this patent is extended or adjusted under 35 U.S.C. 154(b) by 76 days.

(21) Appl. No.: 11/693,004

(22) Filed: Mar. 29, 2007

(65) Prior Publication Data
US 2008/0238520 A1 Oct. 2, 2008

(51) Int. Cl.
H03K 17/04 (2006.01)
(52) U.S. Cl. .................. 327/375; 327/108; 327/423
(58) Field of Classification Search .......... 327/108, 327/375, 423
See application file for complete search history.

(56) References Cited

U.S. PATENT DOCUMENTS

| 5,210,479 | A | * | 5/1993 | Kimura et al. ............. 318/727 |
| 5,500,616 | A | | 3/1996 | Ochi |
| 5,528,189 | A | * | 6/1996 | Khatibzadeh ............... 327/314 |
| 5,596,466 | A | | 1/1997 | Ochi |
| 6,724,227 | B2 | * | 4/2004 | Imai ........................... 327/108 |
| 6,859,087 | B2 | * | 2/2005 | Galli et al. .................. 327/423 |
| 2006/0108684 | A1 | | 5/2006 | Stevanovic et al. |

* cited by examiner

*Primary Examiner*—Lincoln Donovan
*Assistant Examiner*—John W Poos
(74) *Attorney, Agent, or Firm*—Ann M. Agosti (57) ABSTRACT

A power electronic module includes: a switch module including a desaturation detection diode and a power semiconductor switch, and wherein the desaturation detection diode is coupled to a switching connection of the power semiconductor switch; and a driver module coupled to the switch module, wherein the driver module is configured for obtaining a voltage signal across the desaturation detection diode and the power semiconductor switch and configured for turning off the power semiconductor switch upon the voltage signal exceeding a threshold. In one example, the driver module is discrete from the switch module. In another example, the switch module and driver modules are configured to respectively provide and receive a voltage signal of less than or equal to seventy volts.

29 Claims, 5 Drawing Sheets

POWER ELECTRONIC MODULE INCLUDING DESATURATION DETECTION DIODE

BACKGROUND

The subject matter disclosed herein relates generally to power electronic modules.

Many gate drivers for power electronic switches such as insulated gate bipolar transistors (IGBTs) and metal oxide semiconductor field effect transistors (MOSFETs) use a desaturation detection technique to determine if a switch is in an over-current state. Upon desaturation detection, the gate driver is then capable of turning off the switch in a controlled and swift manner in order to attempt to prevent switch destruction and damage. A desaturation detection circuit typically comprises a diode including a cathode that is connected to the switch's collector or drain. Current is injected into the desaturation detection diode using an appropriate source, and the emitter or source serves as the return path.

Typical desaturation detection diodes have reverse recovery times on the order of one hundred nanoseconds and current ratings on the order of one ampere. The reverse recovery of such diodes is designed to be as small as possible and in the worst case should typically be at least on par with the rate of the total switching time of the switch. Because current on the order of ten milliamperes to twenty milliamperes is injected into the switch, the current rating of such desaturation detection diodes generally needs only be on the order of fifty milliamperes. The voltage rating of such diodes must be at least as high as the voltage rating of the switch. For high voltage switches (with two examples being 1200V and 1700V switches), diodes are typically connected in series. Series coupling may lead to added problems of matching the intrinsic parameters to ensure equal sharing of the blocking voltage, particularly during switching transients. Silicon carbide diodes typically can withstand these high voltages and have very low to negligible reverse recovery times. However, silicon carbide diodes typically have current ratings that are greater than five amperes and are often only available in bulky packages.

Conventional desaturation detection approaches are designed to integrate the desaturation detection diode within the gate driver circuit and include high voltage cables between the switch and the gate driver circuit. It would be desirable to have a desaturation detection system with improved reliability and reduced parasitic inductance. It would also be desirable to eliminate the conventional high voltage cable that carries desaturation signals between the gate driver and the power switch module.

BRIEF DESCRIPTION

Briefly, in accordance with one embodiment, a power electronic module comprises: a switch module comprising a desaturation detection diode and a power semiconductor switch, wherein the desaturation detection diode is coupled to a switching connection of the power semiconductor switch; and a driver module coupled to the switch module, wherein the driver module is discrete from the switch module, wherein the driver module is configured for obtaining a voltage signal across the desaturation detection diode and the power semiconductor switch and configured for turning off the power semiconductor switch upon the voltage signal exceeding a threshold.

In accordance with another embodiment, a power electronic module comprises: a switch module comprising an integrated package, wherein the integrated package comprises a desaturation detection diode, a controllable power semiconductor switch, and a clamp coupled across the desaturation detection diode and the power semiconductor switch return, and wherein the desaturation detection diode is coupled to a switching connection of the controllable power semiconductor switch; and a driver module coupled to the switch module, wherein the driver module is configured for obtaining a voltage signal across the desaturation detection diode and the power semiconductor switch return and for turning off the controllable power semiconductor switch upon the voltage signal exceeding a threshold, wherein the switch module and driver modules are configured to respectively provide and receive a voltage signal of less than or equal to seventy volts.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
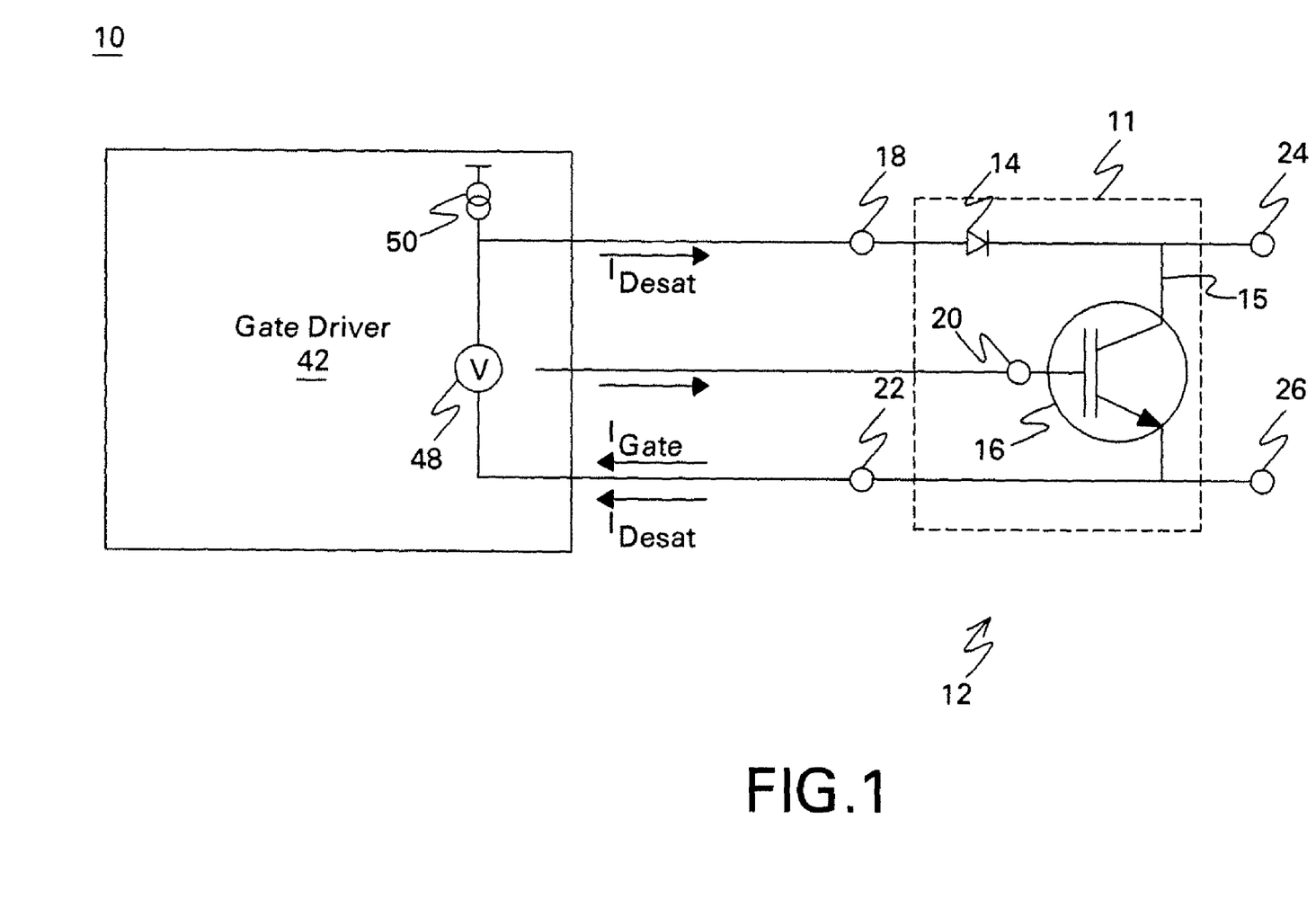
FIG. 1 is a circuit diagram of a power electronic module in accordance with one embodiment disclosed herein.

FIG. 1 is a circuit diagram of a power electronic module 10 in accordance with one embodiment wherein power electronic module 10 comprises a switch module 12 and a discrete driver module 42. Switch module 12 comprises a desaturation detection diode 14 and a power semiconductor switch 16 with desaturation detection diode 14 being coupled to a switching connection 15 of power semiconductor switch 16. Driver module 42 is discrete from switch module 12 and is configured for obtaining a voltage signal across desaturation detection diode 14 and power semiconductor switch 16 and for turning off power semiconductor switch 16 upon the voltage signal exceeding a threshold. As used herein, "a" or "an," when preceding an element, is intended to cover both singular and plural forms of the element.

When used herein, "discrete" means that, although the switch and driver modules may ultimately be in a common package to form the power electronic module, driver module 42 is not situated on a common substrate with either desaturation detection diode 14 or power semiconductor switch 16.

In a more specific embodiment, desaturation detection diode 14 and power semiconductor switch 16 comprise an integrated package 11. As used herein, "integrated" means that the desaturation detection diode may be situated on the same substrate as the power semiconductor switch or on the same substrate as a switching element 36 or 136 (FIG. 5) of the power semiconductor switch.

One anticipated advantage of the embodiments disclosed herein is that the conventional high voltage cable can be reduced to a lower voltage signal being used between the switch and driver modules. Although higher voltages can be used in some embodiments, in one embodiment the voltage signal is at a level of less than or equal to seventy volts. In a more specific embodiment, the voltage signal is less than or equal to twenty volts. Although use of discrete switch and driver modules is believed to be useful for ease of power electronic module fabrication and for maintaining such low voltage connections, the discrete embodiment is not required.

Power semiconductor switch 16 typically comprises a controllable switch (meaning a switch that can be turned on or off) with one example being an insulated gate bipolar transistor (IGBT) and other examples being discussed below. IGBT 16 includes a collector 24, a gate 20, and an emitter 26. In the IGBT embodiment, desaturation detection diode 14 is coupled to collector 24. Power semiconductor switch 16 may comprise any appropriate semiconductor with several examples including silicon carbide and silicon.

Desaturation detection diode 14 comprises a diode configured to accommodate at least as high a voltage level as the power semiconductor switch to which it will be coupled. Desaturation detection diode 14 will typically be designed as a low current diode (on the order of 50 milliamperes to 1000 milliamperes, for example), although higher currents can optionally be used.

Figure 7:
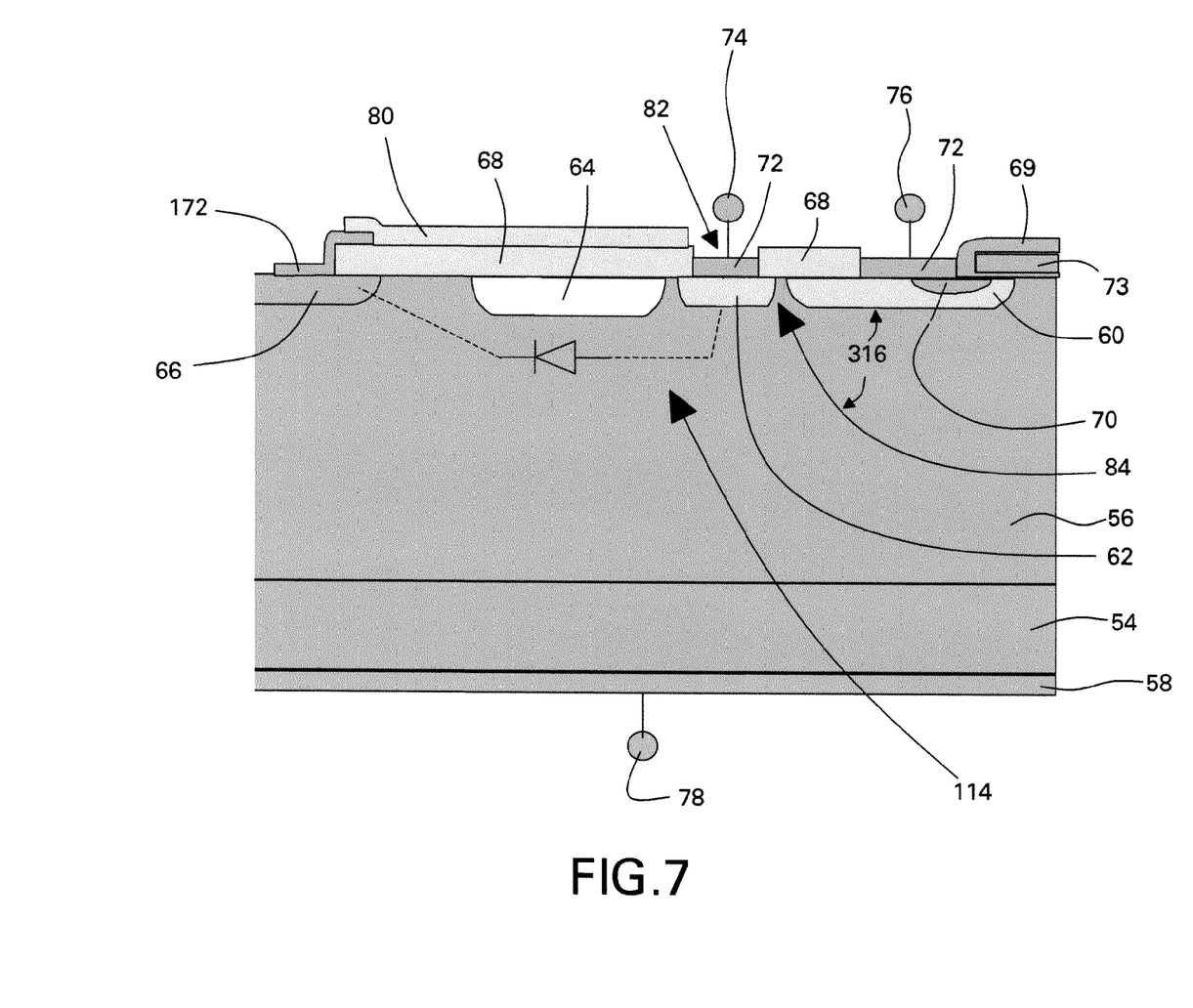
FIG. 7 is a side cross-sectional view of a switch die in accordance with another embodiment disclosed herein.

Desaturation detection diode 14, like power semiconductor switch 16, may comprise any appropriate material with several examples including silicon carbide and silicon. Furthermore, the same material or different materials may be used for power semiconductor switch 16 and desaturation detection diode 14. For example, in one embodiment, power semiconductor switch 16 may comprise silicon, and desaturation detection diode 14 may comprise silicon carbide. In another example embodiment, both power semiconductor switch 16 and desaturation detection diode 14 comprise silicon carbide. Although not required, it is expected to be useful to match the diode and switch characteristics. In one example, as shown in FIG. 7, such matching may be accomplished by use of a switch module wherein the desaturation detection diode and the power semiconductor switch share a common blocking junction.

In the embodiment of FIG. 1, wherein power semiconductor switch 16 comprises gate 20, driver module 42 includes a voltage sensor 48 coupled across desaturation detection diode 14 (at a terminal 18, for example) and power semiconductor switch 16 (at a return 22, for example). After power semiconductor switch 16 is fully turned on, driver module 42 injects a small current into desaturation detection diode 14 through a current source 50 and monitors the voltage across voltage sensor 48. During an over-current fault in the power semiconductor switch, the signal across voltage sensor 48 will rise. When the voltage across voltage sensor 48 exceeds a threshold, driver module 42 is configured to stop supplying voltage or current to gate 20 (that is, turns off switch 16).

In contrast to desaturation detection embodiments wherein high voltage components are situated in the driver module, in FIG. 1, wherein the desaturation detection diode is included within a switch module and discrete from the driver module, high voltage signals need not be fed back to the driver module. Thus, as compared with such conventional embodiments, transmission line parasitics are reduced, and the size and isolation requirements of the driver module and connection are reduced.

Coupling desaturation detection diode 14 to a switching connection 15 of power semiconductor switch 16 provides a low inductance connection. Thus, these embodiments are particularly useful for power modules designed for low inductance and high power density such as described in commonly assigned Stevanovic US20060108684. Driver module 42, aside from being discrete from switch module 12 in the embodiment of FIG. 1, may otherwise be configured in a similar manner as conventional modules with several examples being found in the following data sheets: Mitsubishi M57962L, Semikron SKI10, Fuji EXB840, Fuji EUPEC 2ED020I12-F, International Rectifier IR2214, and Agilent HCPL316J.

Figure 2:
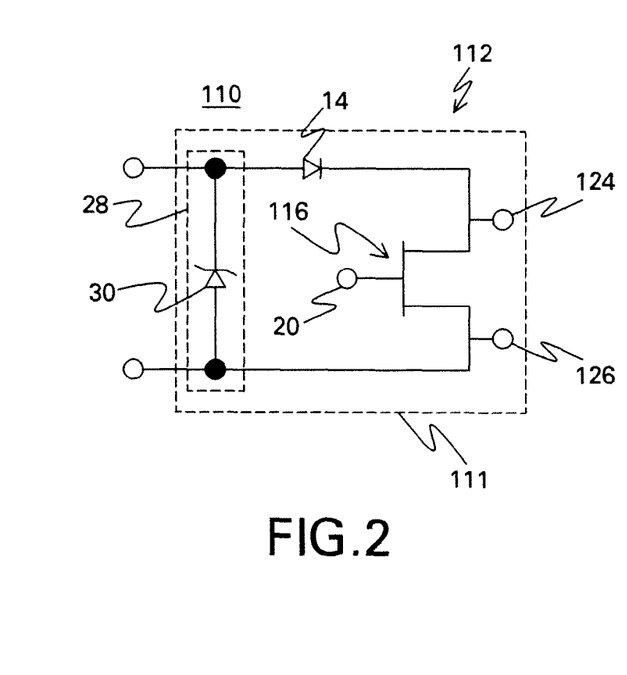
FIG. 2 is a circuit diagram of a power electronic module in accordance with another embodiment disclosed herein.

FIG. 2 is a circuit diagram of a power electronic module 110 in accordance with another embodiment wherein power electronic module 110 further comprises a voltage clamp 28 coupled across desaturation detection diode 14 and power semiconductor switch 116. Clamp 28 is configured to maintain the voltage going into desaturation detection diode 14 at a sufficiently low level, which in one example ranges from twelve volts to eighteen volts. Clamp 28 is optionally part of switch module 112 or more specifically is optionally part of integrated package 111.

Any appropriate clamp may be used. In one embodiment, for example, the clamp comprises an element 30 such as a Zener diode, a transorb voltage suppressor, or a transient voltage suppressor. Like power semiconductor switch 16 and desaturation detection diode 14, Zener diode 30 may comprise any appropriate material (either the same as or different from the other elements) with several examples including silicon carbide and silicon.

The embodiment of FIG. 2 additionally illustrates a different type of switch as compared with the embodiment of FIG. 1. Controllable switch 116 comprises a metal oxide semiconducting field effect transistor (MOSFET) including a gate 20, a drain 124, and a source 126. Desaturation detection diode 14 is coupled to drain 124 of the MOSFET. The IBGT and MOSFET switches are shown herein for purposes of example, but any controllable power semiconductor switch may be used. Several other examples include bipolar junction transistors, junction field effect transistors, and gate turn off thyristors. Additionally, it is expected that other types of controllable power semiconductor switches may be invented in the future and would also be appropriate for use with the embodiments disclosed herein.

Figure 3:
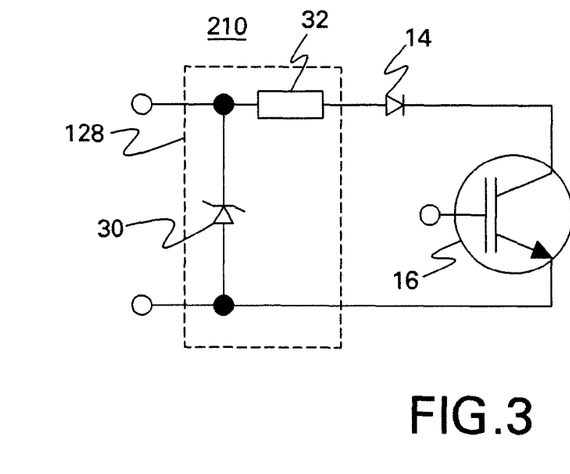
FIG. 3 is a circuit diagram of a power electronic module in accordance with another embodiment disclosed herein.

FIG. 3 is a circuit diagram of a power electronic module 210 in accordance with another embodiment wherein a clamp 128 further comprises a damping resistor 32 coupled between clamping Zener diode 30 and desaturation detection diode 14. Damping resistor 32 further limits the current in the clamp. In one embodiment, the damping resistor has a resistance range of two ohms to 300 ohms.

Figure 4:
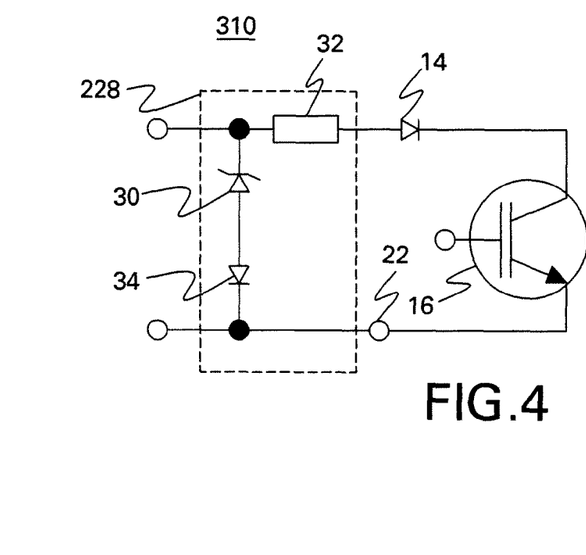
FIG. 4 is a circuit diagram of a power electronic module in accordance with another embodiment disclosed herein.

FIG. 4 is a circuit diagram of a power electronic module 310 in accordance with another embodiment wherein a clamp 228 further comprises a reverse current blocking diode 34 between clamping Zener diode 30 and power semiconductor switch return 22. In an even more specific embodiment, the reverse current blocking diode comprises a Zener diode. For power semiconductor switches having high current and voltage, the reverse current blocking diode 34 is useful to prevent the main reverse switch current, that should normally flow through an anti-parallel diode (not shown) of the main switch, from flowing in the clamp 228. In another embodiment, a reverse current blocking impedance may be used instead of diode 34.

Figure 5:
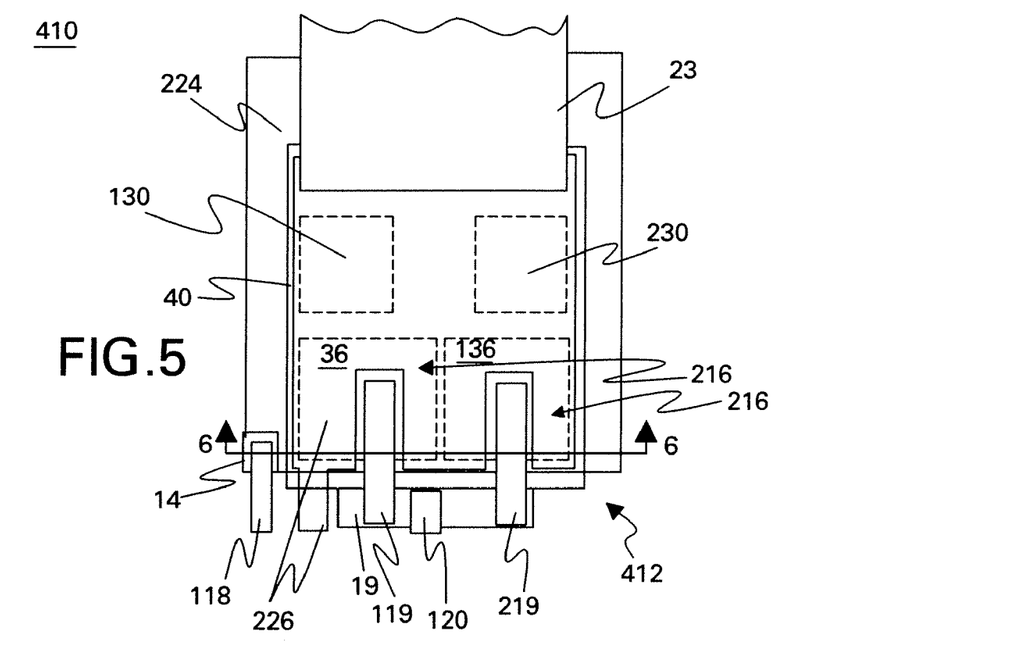
FIG. 5 is a partial top view of a power electronic module in accordance with another embodiment disclosed herein.
Figure 6:
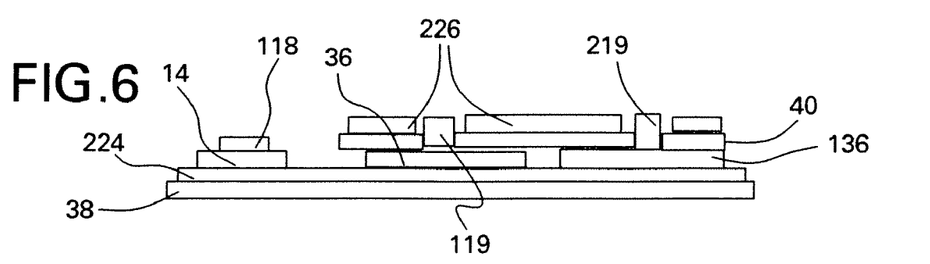
FIG. 6 is a partial side cross-sectional view of the embodiment of FIG. 5.

FIG. 5 is a partial top view of a power electronic module 410 in accordance with another embodiment, and FIG. 6 is a partial side view of the embodiment of FIG. 5. A controllable switch 216 of power electronic module 410 comprises a plurality of coupled switching devices 36 and 136. In such embodiments, one desaturation detection diode 14 per power electronic switch module will typically be sufficient. In other words, individual switching devices may either share one desaturation detection diode (as shown) or optionally have respective individual desaturation detection diodes (not shown). Diodes 130 and 230 of FIG. 5 are anti-parallel diodes.

Also illustrated, in FIG. 6, is a substrate 38 supporting both desaturation detection diode 14 and power semiconductor switch 216. Substrate 38 is shown as supporting a conducting plate comprising a collector 224. In the embodiment of FIG. 6, desaturation detection diode 14, and switching devices 36 and 136 are shown as being situated on separate wafers. In an alternative embodiment, these elements may be situated on a common wafer (as shown in FIG. 7). Desaturation detection diode 14 has a connection 118 coupled thereto. In one embodiment wherein power overlay is used, a power overlay insulating layer 40 extends over at least switching devices 36 and 136. Gate connections 119 and 219 extend through openings in the power overlay insulating layer 40 to the switching devices and are brought out to common gate plate 19 (FIG. 5) from which a common gate connection 120 can be attached (FIG. 5). An emitter metal layer 226 is situated over the power overlay insulating layer and not in contact with the gate connections. A connection plate 23 (FIG. 5) may be coupled to emitter metal layer 226 for ease of integration of the switch module within the power electronic module. In another embodiment (not shown), wire bonds are used instead of power overlay.

FIG. 7 is a side view of a section of a switch die in accordance with another embodiment disclosed herein wherein the desaturation detection diode 114 and the power semiconductor switch 316 are situated on a common wafer level substrate 54. In this embodiment, an epitaxial layer 56 of opposite polarity is grown over the waver level substrate. Regions of opposite polarity (such as switch (or base) region 60 and diode region 62) to the epitaxial layer are then provided, by implantation or diffusion for example, into the epitaxial layer along with termination and field stop regions 64 and 66. In region 60, another region 70 of opposite polarity may additionally be provided, for example. A gate 73 may be applied over the epitaxial layer by any conventional method with several examples including deposition, evaporation, and sputtering. A field oxide layer 68 is applied and patterned over the regions followed by patterned metallization 72, 172 (which may comprise one or more types of metallization). An interlayer dielectric layer (IDL) 69 is applied at least partially over gate 73. IDL 69 may comprise a separate layer or be a part of the same application process as field oxide layer 68. Passivation layer 80 may selectively be applied on top of the field oxide layer and patterned metallization. Backside metallization 58 may be applied on substrate 54. In one embodiment, metallization is coupled to a diode pad 74, an emitter pad 76, and a collector pad 78, for example. In this embodiment, desaturation detection diode 114 is included in the same die (wafer) as power semiconductor switch 316, and pad 82 (connection on the top surface) forms the anode of desaturation detection diode 114. The cathode of desaturation detection diode 114 is formed by field stop region 66 on the die. The metallization will be connected (connection not shown) to the collector or backside metallization 58 of the die to make contact of the desaturation detection diode cathode to the power switch collector. Although a gap 84 in regions 60 and 62 is shown for purposes of example, in an alternative embodiment, a trench may be used for diode isolation. In one example, substrate 54 comprises a P+ material, epitaxial layer 56 comprises an N− material, regions 60 and 62 comprise a P− material, and regions 66 and 70 comprise an N+ material.

Figure 8:
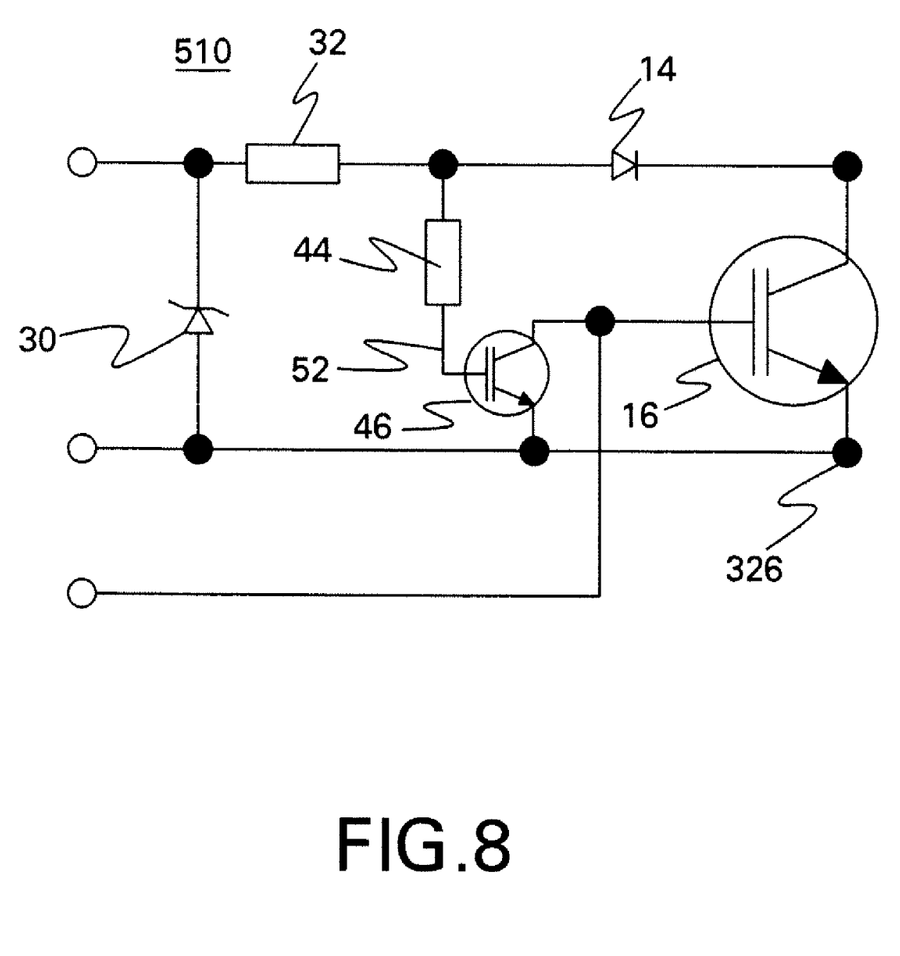
FIG. 8 is a circuit diagram of a power electronic module in accordance with another embodiment disclosed herein.

FIG. 8 is a circuit diagram of a power electronic module 510 in accordance with another embodiment wherein power semiconductor switch 16 includes a gate 20 and wherein power electronic module 510 further comprises: a protection switch 46 coupled to gate 20 of power semiconductor switch 16. In this embodiment, power electronic module 510 further includes an impedance 44 coupled between, on one end, damping resistor 32 and the desaturation detection diode 14 and, on the other end, a control terminal 52 of protection switch 46. Protection switch 46 may comprise any controllable switch, and, in one example, comprises a bipolar junction transistor (BJT). Impedance 44 may comprise any appropriate impedance and, in one example, comprises a resistor. In the embodiment of FIG. 5, impedance 44 is coupled to control terminal 52 (a base in this example) of protection switch 46, and a collector and emitter of protection switch 46 are coupled to the power semiconductor switch gate 20 and emitter 326, respectively. If a gate signal is present and the line voltage across desaturation detection diode 14 becomes too high, protection switch 46 will begin to conduct. Due to the location of protection switch 46, being in the conducting state will short circuit the power semiconductor switch gate-emitter terminals and effectively turn off power semiconductor switch 16. The protection switch remains on until either the desaturation voltage is externally reduced or the gate voltage to the power switch is cleared. This embodiment may be used to protect power semiconductor switch 16 in the event that the driver module fails to respond, or is slow in responding, and as an ultrafast responding error protection. It may also be designed to operate at a detection voltage level set above the gate-driver module threshold level.

The embodiments discussed above may be used in any appropriate combination. For example, in one combination embodiment, a power electronic module comprises: a switch module comprising an integrated package 12, wherein the integrated package comprises a desaturation detection diode 14, a controllable power semiconductor switch, and a clamp 28 coupled across the desaturation detection diode and the power semiconductor switch, and wherein the desaturation detection diode is coupled to a switching connection of the controllable power semiconductor switch 16; and a driver module 42 coupled to the switch module, wherein the driver module is configured for obtaining a voltage signal across the desaturation detection diode and the power semiconductor switch and is configured for turning off the controllable power semiconductor switch upon the voltage signal exceeding a threshold, wherein the switch module and driver modules are configured to respectively provide and receive a voltage signal of less than or equal to seventy volts.

Additionally, in some of the various embodiments where the following elements are present, the desaturation detection diode, the anti-parallel diode, the reverse current blocking diode, and the controllable power semiconductor switch may each comprise, independently, a material selected from the group consisting of silicon carbide and silicon. In a more specific embodiment, all the semiconductor devices comprise silicon carbide.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A power electronic module comprising:
a switch module comprising a desaturation detection diode and a power semiconductor switch, and wherein the desaturation detection diode is coupled to a switching connection of the power semiconductor switch;
a driver module coupled to the switch module, wherein the driver module is discrete from the switch module, wherein the driver module is configured for obtaining a voltage signal across the desaturation detection diode and the power semiconductor switch and configured for turning off the power semiconductor switch upon the voltage signal exceeding a threshold; and
a clamp coupled across the desaturation detection diode and the power semiconductor switch.

2. The power electronic module of claim 1 wherein the desaturation detection diode and the power semiconductor switch share a common blocking junction.

3. The power electronic module of claim 2 wherein the desaturation detection diode and the power semiconductor switch are situated on a common substrate and further comprising a cable coupling the driver and switch modules, wherein, during operation, the cable carries a lower voltage than the voltage passing through the power semiconductor switch.

4. The power electronic module of claim 1 wherein the power semiconductor switch comprises a controllable switch.

5. The power electronic module of claim 4 wherein the controllable switch comprises an insulated gate bipolar transistor (IGBT), and wherein the desaturation detection diode is coupled to a collector of the IGBT.

6. The power electronic module of claim 4 wherein the controllable switch comprises a metal oxide semiconducting field effect transistor (MOSFET) and wherein the desaturation detection diode is coupled to a drain of the MOSFET.

7. The power electronic module of claim 4 wherein the controllable switch comprises a switching device selected from the group consisting of bipolar junction transistors, junction field effect transistors, and gate turn off thyristors.

8. The power electronic module of claim 4 wherein the controllable switch comprises a plurality of coupled switching devices.

9. The power electronic module of 9 claim 1 wherein the integrated package comprises the clamp.

10. The power electronic module of claim 1 wherein the clamp comprises a Zener diode, a transorb voltage suppressor, or a transient voltage suppressor.

11. The power electronic module of claim 1 wherein the clamp comprises a Zener diode, and wherein the Zener diode comprises a material selected from the group consisting of silicon carbide and silicon.

12. The power electronic module of claim 11 wherein the clamp further comprises a damping resistor coupled between the Zener diode and the desaturation detection diode.

13. The power electronic module of claim 12 wherein the clamp further comprises a reverse current blocking diode coupled between the Zener diode and the power semiconductor switch.

14. The power electronic module of claim 13 wherein the reverse current blocking diode comprises an additional Zener diode.

15. The power electronic module of claim 1 wherein the desaturation detection diode and the power semiconductor switch are situated on a common wafer level substrate.

16. A power electronic module comprising:
a switch module comprising a desaturation detection diode and a power semiconductor switch, wherein the desaturation detection diode is coupled to a switching connection of the power semiconductor switch, and wherein the desaturation detection diode and the power semiconductor switch are situated on a common wafer level substrate;
a driver module coupled to the switch module, wherein the driver module is discrete from the switch module, wherein the driver module is configured for obtaining a voltage signal across the desaturation detection diode and the power semiconductor switch and configured for turning off the power semiconductor switch upon the voltage signal exceeding a threshold; and
further comprising isolated diode and switch regions each comprising a common polarity.

17. The power electronic module of claim 16 further comprising a field stop region of power semiconductor switch wherein the field stop region also comprises a cathode of desaturation detection diode.

18. The power electronic module of claim 15 wherein the desaturation detection diode and the power semiconductor switch share a common blocking junction.

19. The power electronic module of claim 1 wherein desaturation detection diode and power semiconductor switch have matched characteristics.

20. The power electronic module of claim 1 wherein the power semiconductor switch includes a gate, wherein the clamp comprises a Zener diode and a damping resistor coupled between the Zener diode and the desaturation detection diode, and wherein the power electronic module further comprises:
a protection switch coupled to the gate of the power semiconductor switch; and
an impedance coupled between, on one end, the damping resistor and the desaturation detection diode and, on the other end, a control terminal of the protection switch.

21. The power electronic module of claim 1 wherein the desaturation detection diode comprises a material selected from the group comprising silicon, silicon carbide, and combinations thereof.

22. The power electronic module of claim 1 wherein the power semiconductor switch comprises a material selected from the group comprising silicon, silicon carbide, and combinations thereof.

23. A power electronic module comprising:
a switch module comprising an integrated package, wherein the integrated package comprises a desaturation detection diode, a controllable power semiconductor switch, and a clamp coupled across the desaturation detection diode and the power semiconductor switch, and wherein the desaturation detection diode is coupled to a switching connection of the controllable power semiconductor switch;
a driver module coupled to the switch module, wherein the driver module is configured for obtaining a voltage signal across the desaturation detection diode and the power semiconductor switch and for turning off the controllable power semiconductor switch upon the voltage signal exceeding a threshold, wherein the switch module and driver modules are configured to respectively provide and receive a voltage signal of less than or equal to seventy volts.

24. The power electronic module of claim 23 wherein the controllable switch comprises an insulated gate bipolar transistor, a metal oxide semiconducting field effect transistor, a bipolar junction transistor, a junction field effect transistor, or a gate turn off thyristor and wherein the desaturation detection diode and the controllable power semiconductor switch share a common blocking junction.

25. The power electronic module of claim 23 wherein the clamp comprises a Zener diode.

26. The power electronic module of claim 25 wherein the clamp further comprises a damping resistor coupled between the Zener diode and the desaturation detection diode.

27. The power electronic module of claim 26 wherein the clamp further comprises a reverse current blocking diode coupled between the Zener diode and the power semiconductor switch.

28. The power electronic module of claim 27 wherein the desaturation detection diode, the reverse current blocking diode, and the controllable power semiconductor switch each comprise, independently, a material selected from the group consisting of silicon carbide and silicon.

29. The power electronic module of claim 27 wherein the desaturation detection diode, the reverse current blocking diode, and the controllable power semiconductor switch each comprise silicon carbide.

* * * * *